(12) United States Patent
Xiao

(10) Patent No.: US 6,472,766 B2
(45) Date of Patent: Oct. 29, 2002

(54) STEP MASK

(75) Inventor: Guangming Xiao, Austin, TX (US)

(73) Assignee: Photronics, Inc., Brookfield, CT (US)

(*) Notice: Subject to any disclaimer, the term of this patent is extended or adjusted under 35 U.S.C. 154(b) by 0 days.

(21) Appl. No.: 09/755,438

(22) Filed: Jan. 5, 2001

(65) Prior Publication Data

US 2002/0127881 A1 Sep. 12, 2002

(51) Int. Cl.⁷ .............................................. H01L 23/544
(52) U.S. Cl. ........................................ 257/797; 257/98
(58) Field of Search ............................ 257/59, 72, 88, 257/98, 116, 443, 456, 797

(56) References Cited

U.S. PATENT DOCUMENTS

| | | | |
|---|---|---|---|
| 3,900,737 A | * | 8/1975 | Collier et al. ............... 250/492 |
| 5,308,721 A | | 5/1994 | Garofalo et al. |
| 5,376,483 A | | 12/1994 | Rolfson |
| 5,672,450 A | | 9/1997 | Rolfson |
| 5,688,415 A | | 11/1997 | Bollinger et al. |
| 5,738,757 A | | 4/1998 | Burns et al. |
| 5,821,013 A | | 10/1998 | Miller et al. |
| 5,853,921 A | | 12/1998 | Moon et al. |
| 5,935,740 A | | 8/1999 | Pierrat |
| 5,994,001 A | | 11/1999 | Nakao |
| 6,165,651 A | * | 12/2000 | Adair et al. ................... 430/5 |
| 6,329,106 B1 | * | 12/2001 | Bae et al. ....................... 430/5 |

* cited by examiner

Primary Examiner—David Nelms
Assistant Examiner—David Nhu
(74) Attorney, Agent, or Firm—Amster, Rothstein & Ebenstein

(57) ABSTRACT

A step mask having a plurality of test cells and a method for producing the same. Each test cell of the step mask is etched for a different amount of time and therefore has a different etch depth or height. The number of phase shifter layer etch iterations can be conducted on a column-by-column and row-by-row basis to decrease the number of etch iterations.

16 Claims, 5 Drawing Sheets

Step Mask Following Column-by Column Etching

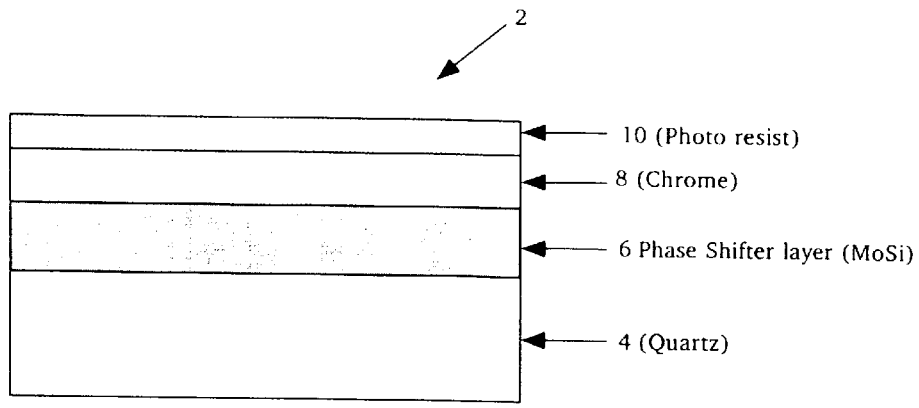
FIG. 1 - Blank PSM
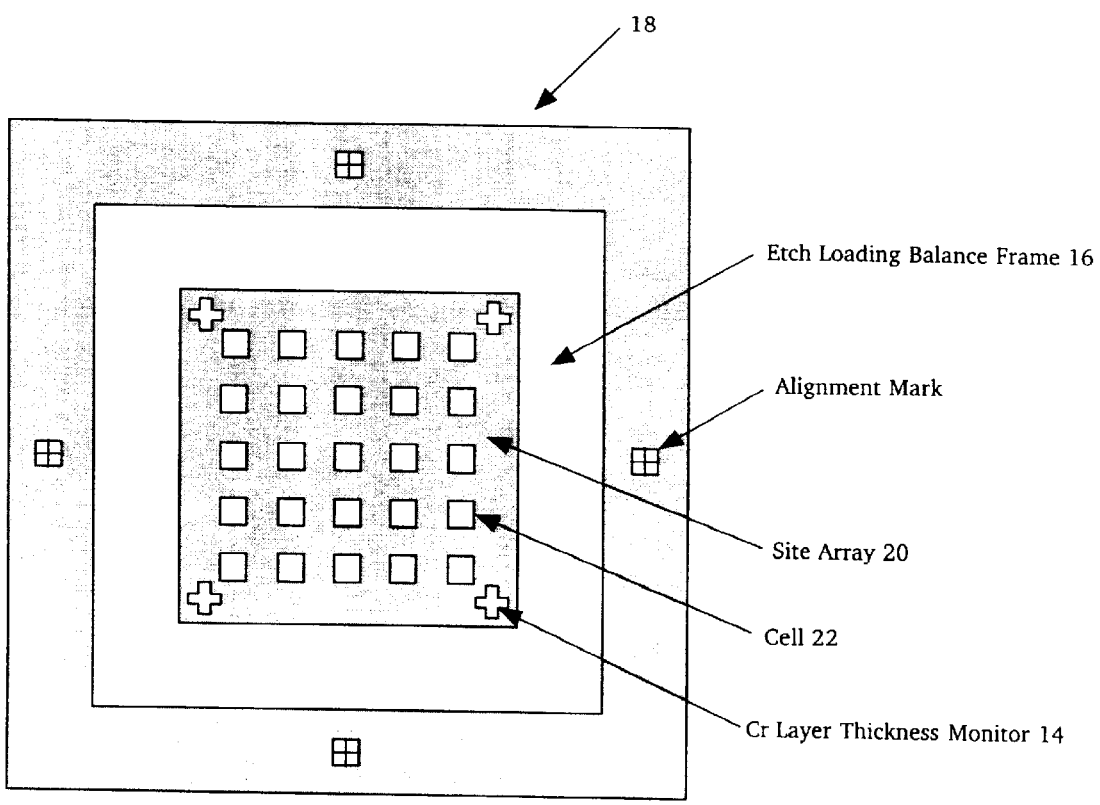
FIG. 2 - General Layout of Step Mask

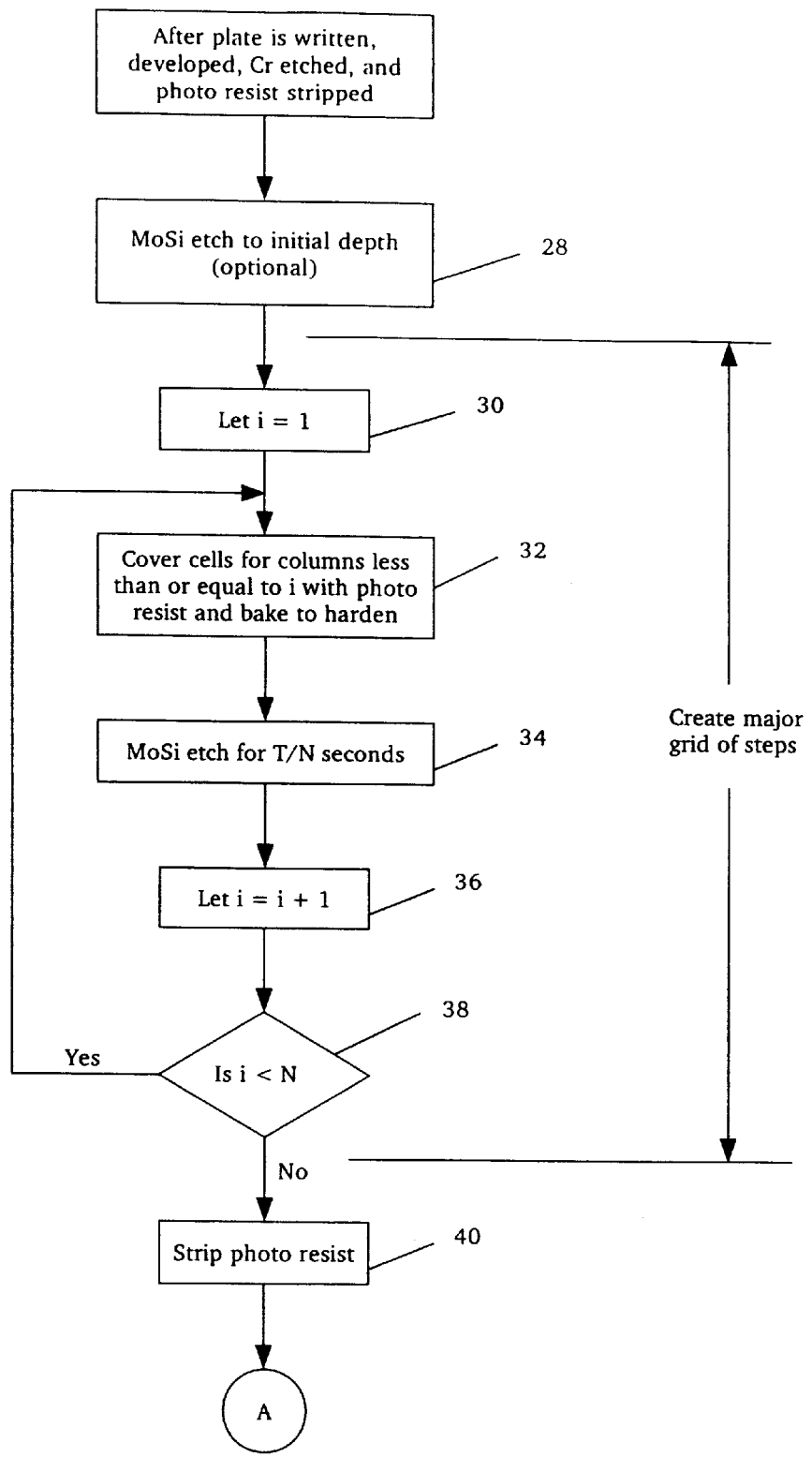
FIG. 3 - Preferred Method of Creating Step Mask

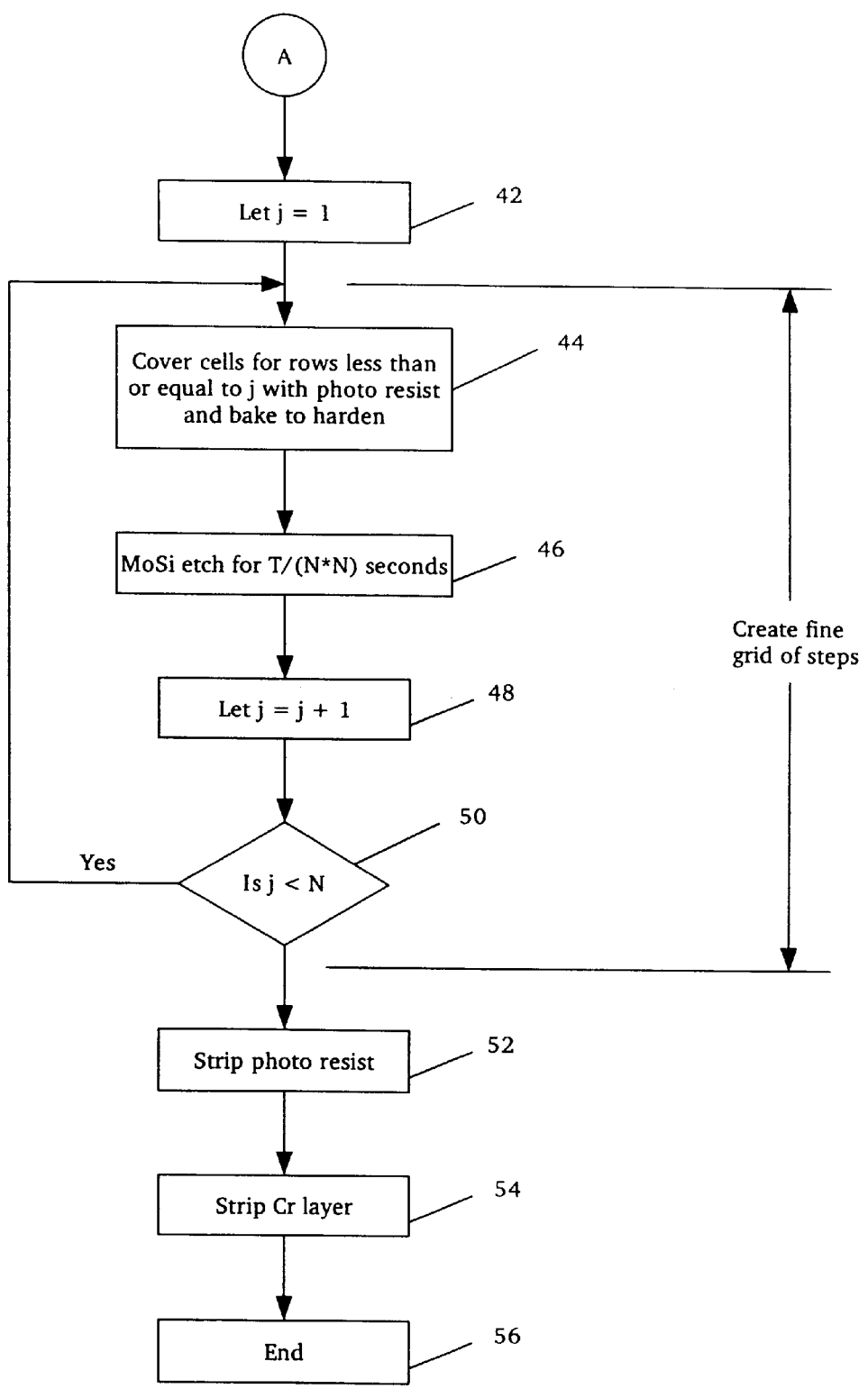
FIG. 3 - Continued

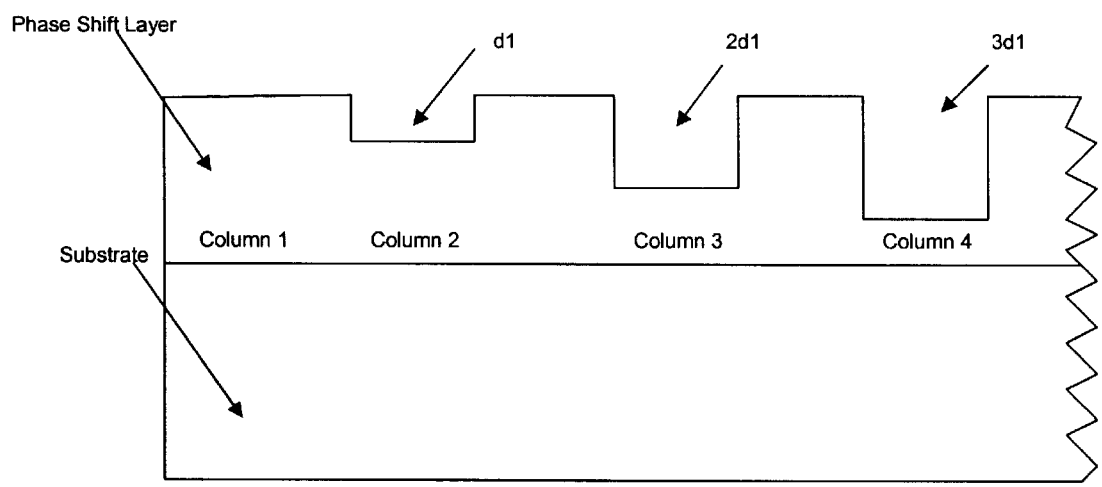
FIG. 4 – Step Mask Following Column-by Column Etching

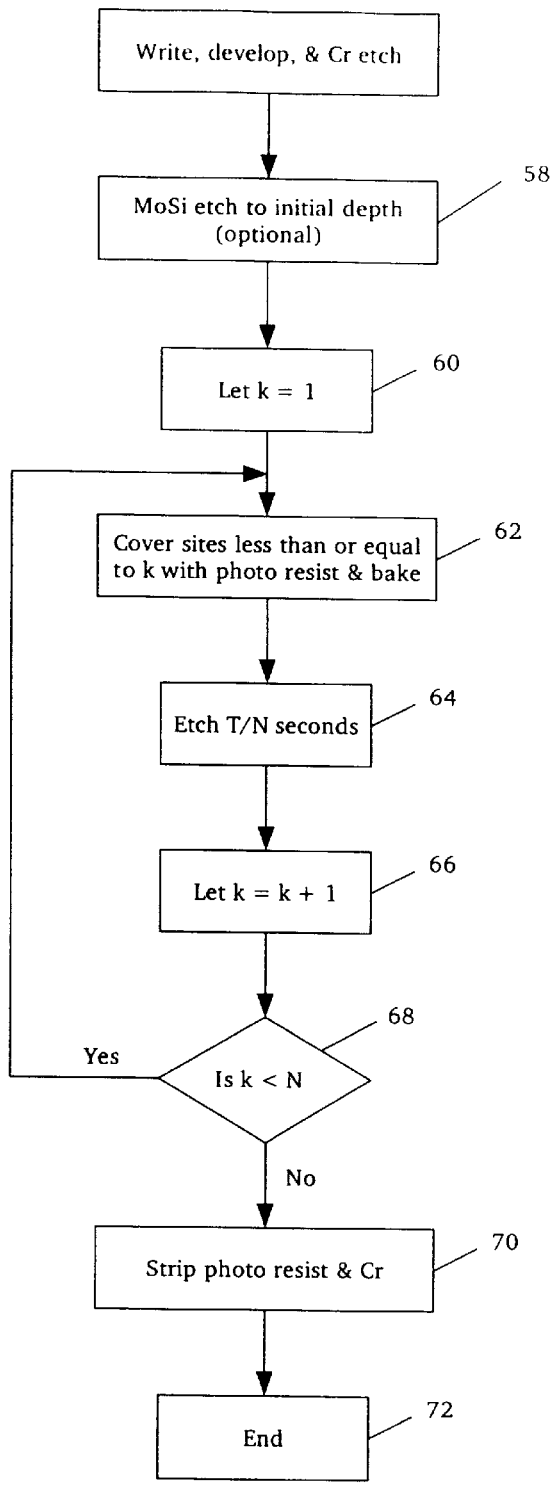
FIG. 5 - Alternative Method for Creating Step Mask

STEP MASK

BACKGROUND OF INVENTION

1. Field of Invention

The present invention is directed to step mask having a plurality of test cells and a method of producing the same. Each test cell of the step mask is etched for a different amount of time and therefore has a different etch depth or height. The number of phase shifter layer etch iterations can be conducted on a column-by-column and row-by-row basis to decrease the number of etch iterations.

2. Description of Related Art

Photomasks are used in the semiconductor industry to transfer micro-scale images defining a semiconductor circuit onto a silicon or gallium arsenide wafer. In its simplest form a photomask is comprised of a transparent substrate and a patterned layer opaque material, the pattern of the opaque material being a scaled negative of the image desired to be formed on the semiconductor wafer.

To create an image on a semiconductor wafer, photomask is interposed between an undeveloped semiconductor wafer which includes a layer of photosensitive material and an energy source commonly referred to as a Stepper. Energy from the Stepper is inhibited from passing through the areas of the photomask in which the opaque material is present. However, energy generated by the Stepper passes through the portions of the substrate of the photomask not covered by the opaque material and causes a reaction in the photosensitive material on the semiconductor wafer. Through subsequent processing the image created on the photosensitive material is transferred to the silicon or gallium arsenide wafer.

As circuit densities on semiconductor wafers have continued to increase and the minimum feature size on semiconductor wafers have continued to shrink, optical lithography has entered the sub-wavelength regime and is approaching its resolution limits. Extending the use of optical Steppers into deep sub-wavelength has necessitated the development of new technologies such as phase shift lithography and the use of phase shift masks.

In general, phase shift lithography uses the interference of light rays to overcome diffraction and improve the resolution of optical images projected onto a semiconductor wafer. There are currently two general types of PSMs. The first type of PSM is an embedded attenuating phase shift mask (EAPSM) which is comprised of an etched phase shifter layer (e.g., MoSi) and a quartz substrate. The second type of PSM is an alternating aperture phase shift mask (AAPSM) which is comprised of a lawyer of opaque material (e.g., chromium) and an etched quartz substrate. For EAPSMs, it is critical to create correct phase and transmission characteristics, and in order to achieve correct phase and transmission characteristics a very definitive end point has to be achieved during the MoSi etching processes. Further, a clear understanding of how phase, transmission, and etch rate depend on etch depth is important. However, optical properties and chemical stoichiometry of the phase shifter layer of PSMs are non-homogenous. Consequently, index of refraction, extinction coefficient and etch rate vary across the phase shifter layer of PSMs. Furthermore, PSM blanks are different from supplier to supplier, each having a different thickness of phase shifter layer.

Traditional methods used to characterize the phase, transmission, and etch rate of PSMs and their correlation to etch depth require multiple etching steps with the transmission and etch depth being measured after each etch step. The major disadvantages of these methods include (1) long lead time because of measurements made after each etch step, (2) loss of information from the previous etch step after each new etch step is performed, (3) phase measurements cannot be obtained prior to the Cr being striped, and (4) high costs since multiple masks are normally required. Further, the effects of phase and transmission on metrology and inspection tools is are still unclear. Currently there is no known standard for critical dimension (CD) measurement of PSMs, since the full effects of phase and transmission must be understood before a standard can be established.

Finally, it is not fully understand how phase and transmission effects the images created on semiconductor wafers requiring the study of PSMs having various phase and transmission scenarios. Although multiple phase shift masks can be used for such study, this would be costly and would introduce the additional variable of PSM blank variation. Therefore, if various phase and transmissions can be produced on a single PSM, it would greatly increase efficiency and lower costs.

SUMMARY OF INVENTION

Accordingly, it is the object of the present invention to provide a step mask having a plurality of test cells or sites of various etch depths created using a process set forth below which overcomes the disadvantages described above with respect to methods known in the prior art.

It is a further object of the present invention to provide a test mask which can be used to study the phase effect on critical dimension measurements and inspection and wafer printability.

It is a further object of the present invention to provide a step mask that can be produced with a short turnaround time.

It is yet another object of the present invention to provide a step mask which preserves information for each etch step.

It is yet another object of the present invention to provide a step mask which enables measurement efficiency since information on various etch depths or heights can be taken at the same time on a single mask.

It is still a further object of the present invention to provide a step mask that can be used as a standard for phase and transmission correlation with etch depth.

BRIEF DESCRIPTION OF DRAWINGS

FIG. 1 is a cross-sectional view of a blank phase shift mask from which the step mask is produced.

FIG. 2 depicts the general layout of a completed step mask.

FIG. 3 is a flow diagram defining the preferred method to create a step mask.

FIG. 4 depicts the step mask after column-by-column phase shifter layer etching.

FIG. 5 is a flow diagram defining an alternative method to creating a step mask.

It will be appreciated by those skilled in the art that FIGS. 1 through 5 are for illustrative purposes and therefore are not necessarily to scale.

DETAILED DESCRIPTION OF THE INVENTION

A finished EAPSM is produced from a EAPSM blank mask which is comprised of four distinct layers. As shown in FIG. 1, a blank mask 2 is comprised of a quartz substrate 4, a phase shifter layer 6, typically Molydbenum Silicide (MoSi), a layer of opaque material 8, typically chromium (Cr), and a layer of photo resist material 10. While MoSi is typically used as a phase shifter layer on photomasks for use with a 248 nm illumination Stepper, those skilled in the art will understand that other materials may be used as the phase shifter layer on photomasks for use with different types of Steppers.

The desired pattern to be created on blank mask 2 is shown in FIG. 2 consists primarily of site array 20 having a plurality of test cells or sites 22 generally arranged in a matrix having N columns and N rows. Although shown as generally being square in shape, the test cells can be any desired shape. This pattern, discussed in more detail below, may be defined by an electronic data file loaded into an exposure system which typically scans an electron beam (E-beam) or laser beam in a raster fashion across the photo resist material on the blank mask. One such example of a raster scan exposure system is described in U.S. Pat. No. 3,900,737 to Collier. As the E-beam or laser beam is scanned across the blank mask, the exposure system directs the E-beam or laser beam at addressable locations on the mask as defined by the electronic data file. The areas of the photo resist material that are exposed to the E-beam or laser beam (i.e., the areas corresponding to the tests cells) become soluble while the unexposed portions remain insoluble. Alternatively, those skilled in the art will appreciate that negative photo resist material can be utilized, areas of which become insoluble when exposed to the E-beam or laser beam. In such case, the E-beam or laser beam would be directed to expose those areas of the photo resist material not corresponding to the desired pattern to be created.

After the exposure system has scanned the desired pattern onto the photo resist material, the mask is developed and the soluble photo resist is removed by means well known in the art. The unexposed, insoluble photo resist material remains adhered to the Cr opaque material. Subsequently, the exposed Cr opaque material no longer covered by the photo resist material is removed by a well known etching process and only the portions of Cr opaque material residing beneath the remaining photo resist material remain affixed to the MoSi phase shift layer. As known by those skilled in the art, the Cr opaque material may be removed using a dry-etching process (also referred to as plasma etching) which utilizes electrified gases to remove the exposed Cr opaque material. The dry-etching process is conducted in vacuum chamber in which gases, typically chlorine and oxygen, are injected. An electrical field is created between an anode and a cathode in the vacuum chamber thereby forming a reactive gas plasma. Positive ions of the reactive gas plasma are accelerated toward the mask which is oriented such that the surface area of the quartz substrate is perpendicular to the electrical field. The directional ion bombardment enhances the etch rate of the Cr opaque material in the vertical direction but not in the horizontal direction (i.e., the etching is anisotropic or directional). Following the etching of the Cr opaque material, the remaining photo resist material is striped from the mask using techniques well known in the art, and the mask is cleaned.

After the blank PSM as been written, developed, Cr etched, photo resist stripped, and cleaned, the mask is ready to go through multiple MoSi etch processes to form a step mask. As discussed above, for EAPSMs it is critical to create correct phase and transmission characteristics which, in turn, requires a very definitive end point (i.e., etch depth) to be achieved during the MoSi etching processes. The process for etching the MoSi phase shifter layer is well known in the art and typically includes the use of fluoride based gases such as $CF_4$ or $SF_6$. A slow etch rate is recommended thereby allowing each etch step to be created in a more controllable manner. As known by those skilled in the art, the etch rate of the MoSi can be controlled by adjusting the gas concentration or by adjusting the pressure within the chamber.

Again with reference to FIG. 2, mask 18 has a plurality of test cells 22 generally arranged in a matrix having N columns and N rows. Accordingly, each test cell can be identified by coordinate pair consisting of a column number and a row number. For example, the test cell in the upper left hand corner of mask can be identified by the coordinates (1,1), the test cell located in upper right hand corner of the mask can be identified by the coordinates (N, 1), and the test cell located in the lower right hand corner of the mask can be identified by the coordinates (N, N).

In the preferred embodiment, the method used to create the step mask with test cells having different etch depths is comprised of two major steps. First, a major grid of step heights or etch depths is created column-by-column. Second, a fine grid of step heights are created row-by-row. More specifically, and with reference to the flow chart of FIG. 3, prior to the column-by-column etching process being commenced, the MoSi phase shifter material may be etched to a predetermined step height 28 $d_0$ thereby narrowing the range of phase shift angles. In the case where a step mask having test cells covering the full range of phase shift is desired (i.e., 0 to 180 degrees), this initial step 28 would not be performed where $d_0$ is equal to zero. The column-by-column etching process being commenced by initially setting the variable i to one (box 30). The test cells at columns numbers less than or equal to i (in the first iteration the test cells corresponding to column 1) are covered by photo resist material which is subsequently baked to harden (box 32). Since photo resist material is applied on a row-by-row and column-by-column basis, conventional spin coat processes cannot be used. However, since the photo resist material is only acting as a protective layer during the dry etch process, uniformity and thickness of the photo resist material is not of concern. Accordingly, a chemical dropper can be used to apply the photo resist material locally to each cell. Next, the test cells corresponding to columns 2 through N are then MoSi etched for a period of $t_c$ seconds (box 34), where the parameter $t_c$ is equal to the time T to etch the MoSi phase shifter layer to a predetermined limit divided by the number of columns N of test cells. In the case where a step mask having test cells covering the full range of phase shift is desired (i.e., 0 to 180 degrees), T would equal the total amount of time to completely etch the MoSi phase shifter material. After the first MoSi etching iteration is complete, the layer of MoSi at the test cells corresponding to columns two through N has been etched a depth of $d_1$, the depth of $d_1$ being directly related to the etch time $t_c$. The test cells corresponding to the first column will not be etched since they are covered by photo resist material.

Next, the variable i is incremented by one (box 36) and it is determined whether or not the new value of i is less than N (box 38). If i is less than N, the above delineated process is repeated and the test cells at columns numbers less than or equal to i (in this case the first and second columns) are covered by photo resist material which is subsequently baked to harden (box 30). The test cells corresponding to columns 3 through N are then MoSi etched for a period of $t_c$ seconds (box 32). After the MoSi etch process is complete, the layer of MoSi at the test cells corresponding to columns three through N has been etched a depth of $2d_1$. The layer of MoSi at test cells corresponding to the second column remains etched at a depth of $d_1$ since these cells are covered by photo resist material during the second etching process. Likewise, the layer of MoSi at test cells corresponding to the first column remain unetched since these test cells are also covered by photo resist material during both the first and second etching processes.

This process is repeated until the variable i is no longer less than N (i.e., until all the test cells except for the test cells corresponding to column N have been covered by photo resist material). As shown in FIG. 4, after the process to create the major grid has been completed the test cells corresponding to the different columns have been progressively etched to different depths. As shown, the test cells corresponding to the first column have not been etched, the test cells corresponding to the second column have been etched to a depth of $d_1$, the test cells corresponding to the third column have been etched at depth of $2d_1$, the test cells corresponding to the fourth column have been etched at depth of $3d_1$, etc.

Next, the second major step in the process is perform in which a fine grid of step heights are created row-by-row. Again with reference to the flowchart of FIG. 3, before starting the row-by-row series of etch iterations to create fine grids all the photo resist needs to be striped from the mask (box 40). Etching iterations similar to those described above with respect to the creation of the major grid of step heights are performed except the iterations proceed row-by-row to create fine grid steps. Also, during the fine grid etch iteration process, the etch time is reduced to $t_r$ seconds where the parameter $t_r$ is equal to $t_c$ divided by N. In other words, the etch time $t_r$ is equal to T (the time to etch the layer of MoSi a predetermined amount) divided by $N^2$ (the number of rows multiplied by the number of columns).

Initially, the variable j is set to one (box 42) and the test cells at row numbers less than or equal to j (in the first iteration the test cells corresponding to row 1) are covered by photo resist material which is subsequently baked to harden (box 44). The tests cells at rows 2 through N are then MoSi etched for a period of $t_r$ seconds (box 46). After the first etch process is complete, the layer of MoSi at the test cells corresponding to rows two through N has been etched an additional depth of $d_2$. Here again, those skilled in the art will understand that depth $d_2$ is directly related to the etch time $t_r$. The layer of MoSi at the test cells corresponding to the first row one will not be etched since they are covered by photo resist material.

Next, the variable j is incremented by one (box 48) and it is determined whether or not the new value of variable j is less than N (box 50). If j is less than N, the test cells at rows numbers less than or equal to j (in the second iteration rows one and two) are covered by photo resist material which is subsequently baked to harden (box 44). The test cells at rows 3 through N are then MoSi etched for a period of $t_r$ seconds (box 46). After the second etch iteration is complete, the layer of MoSi at test cells corresponding to rows three through N has been etched an additional depth of $2d_2$. The etch depth of the layer of MoSi for test cells corresponding to rows one and two remain unchanged due to the presence of the photo resist material.

The process is repeated row-by-row until the variable j is no longer less than N (i.e., all the test cells except for the test cells or sites corresponding to row N have been covered by photo resist material). The photo resist material is then striped from the mask (box 52). Next, the layer of Cr opaque material is striped (box 54) using a commercial available chrome etch agent resulting in a finished step mask (box 56) having a plurality of test cells, the MoSi of each test cell having been etched to a different height or depth. A representative summary of the etch depths for the various test cells for a step mask having four columns and four rows is provided in Table 1. Although this table reflects etch depths for a four column by four row step mask, those skilled in the art will understand that the invention is not limited to such an embodiment, and encompasses a step mask having any number of columns and any number of rowsrows.

TABLE 1

Etch Depths for Various Test Cells or Sites of a Step Mask

|  | Column 1 | Column 2 | Column 3 | Column 4 |
| --- | --- | --- | --- | --- |
| Row 1 | 0 | $d_1$ | $2d_1$ | $3d_1$ |
| Row 2 | $d_2$ | $d_1 + d_2$ | $2d_1 + d_2$ | $3d_1 + d_2$ |
| Row 3 | $2d_2$ | $d_1 + 2d_2$ | $2d_1 + 2d_2$ | $3d_1 + 2d_2$ |
| Row 4 | $3d_2$ | $d_1 + 3d_2$ | $2d_1 + 3d_2$ | $3d_1 + 3d_2$ |

A second more simplified method for creating a step mask is illustrated by the flow chart of FIG. 5. In general, this method proceeds on a test cell-by-test cell basis and is therefore less efficient than the method set forth above. In this embodiment test cells are identified or numbered individually from 1 to N. After the mask has been written, developed, and Cr etched, the MoSi phase shifter material may be etched to a predetermined step height 58 thereby narrowing the range of phase shift. In the case where a step mask having test cells covering the full range of phase shift is desired (i.e., 0 to 180 degrees), this initial step 58 would not be performed. Next, the variable k is set equal to one (box 60). Next, the test cells numbered less than or equal to k (in this case the first test cell) are covered with photo resist which is baked to harden (box 62). The remaining test cells (i.e., test cells 2 through N) are etched for a period of T (i.e., the time to etch the MoSi phase shifter layer a predetermined amount) divided by N (box 64). Here again, in the case where a step mask having test cells having a full range of phase shift values is desired (i.e., 0 to 180 degrees), T would equal the total amount of time to fully etch the MoSi material. Next, the variable k is incremented (box 66), and if the new value of k is less than N (box 68) the above steps are repeated. The process is repeated until all but the last test cell has been covered by photo resist material. The phot resist material and Cr layer are subsequently striped and the mask is cleaned (box 70) resulting in a finished step mask (box 72).

It will be appreciated by those skilled in the art the preferred column-by-column, row-by-row method is more efficient than the test cell-by-test cell method. For example, to create a ten-by-ten or 100 step mask, the test cell-by-test cell method would require 100 etch iterations where the column-by-column, row-by-row method would require only 18 etch iterations.

In order to best ensure that a step mask having designated etch steps is created, certain design rules need to be followed. As discussed above, due to etch rate non-uniformity across a mask during dry etching, the area of the test cell matrix should be small enough (e.g., 50 mm by 50 mm) to reduce the effect of etching non-uniformity. Also, as discussed above, the number of test cells that are covered by photo resist material varies during each etch iteration which affects etch loading and hence the etch rate. In order to compensate for the variation in etch rate, a load balancing frame may be included to minimize etch loading changes caused by the variable test cells being exposed. As shown in FIG. 2, etch balance frame 16 is comprised of MoSi and should be large enough (e.g., 100 times larger in area than the total area of the test cell matrix) so that the number of test cells exposed during any given etch process does not adversely affect the overall etch rate. The etch loading frame can also be used as a clear reference for later phrase and transmission measurements.

As shown in FIG. 2, the step mask may also include Cr layer thickness monitoring areas 14 within the site array 20. The Cr layer thickness monitoring area should go through the same process as test cell (1, 1) described above and as summarized in the flow chart of FIG. 3. Etch depth measurements are preferably carried out before and after MoSi etch iterations and prior to the Cr layer be striped. Since test cell (1,1) and the Cr layer thickness monitoring areas 14 are not exposed to MoSi etch, the difference of depth measurements will give the thickness of the Cr layer which is helpful in establishing a baseline to calculate the MoSi etch rate.

Additionally, although the invention has been described with respect to EAPSMs, it is equally applicable to other types of PSMs including AAPSMs. In the AAPSM embodiment, the quartz substrate is etched to various step heights to provide different test cells having different phase shift values.

Further, for studying of phase effect on inspection and wafer printability, the range of phase (or step height) on the step mask can be adjusted to a smaller margin (e.g., 160 to 200 degrees). As discussed above, the range of phase shift values for the cells can be narrowed by performing a first MoSi etch process (e.g., step 28 of FIG. 3), and setting the value of T (e.g., step 34 of FIG. 3) to a value less than the total amount of time to total etch the MoSi phase shifter material.

Various additional modifications and improvements thereon will become readily apparent to those skilled in the art. For example, within each test cell various patterns could be included for various purposes including depth monitoring, phase/transmission monitoring, critical dimension/contact array with different sizes and tones, and inspection defect patterns. Also, for wafer printability tests, test cells can be replaced by customer designed test patterns.

Further, it will be appreciated by those skilled in the art that materials other than MoSi and Cr and be used for the phase shifter layer and opaque layers described above. Accordingly, the spirit and scope of the present invention is to be construed broadly and limited only by the appended claims, and not by the foregoing specification.

What is claimed is:

1. A step mask comprising a substrate and a layer of phase shifter material, said phase shifter layer including a plurality of cells organized in an array of columns and rows, the phase shifter material at each of said cells having a different step height such that the step height of said phase shifter material for each column of said cells is different than the step height of an adjacent column of cells by at least a first predetermined amount.

2. The step mask of claim 1 wherein the step height of said phase shifter material for each row of said cells is different than the step height of an adjacent row of cells by at least a second predetermined amount.

3. The step mask of claim 1 wherein at least one of said cells has a phase shift value of 180 degrees.

4. The step mask of claim 3 wherein said at least another of one of said cells has a phase shift value of 0 degrees.

5. The step mask of claim 1 further comprising an etch loading balance frame.

6. The step mask of claim 1 further comprising at least two alignment marks.

7. The step mask of claim 1 further comprising at least one opaque layer thickness monitor.

8. The step mask of claim 1 wherein said phase shifter layer is MoSi.

9. A step mask comprising a substrate and a layer of opaque material, including a plurality of cells organized in an array of columns and rows, the substrate material at each of said cells having a different step height such that the step height of said substrate material for each column of said cells is different than the step height of an adjacent column of cells by at least a first predetermined amount.

10. The step mask of claim 9 wherein the step height of said substrate material for each row of said cells is different than the step height of an adjacent row of cells by at least a second predetermined amount.

11. The step mask of claim 9 wherein at least one of said cells has a phase shift value of 180 degrees.

12. The step mask of claim 11 wherein said at least another of one of said cells has a phase shift value of 0 degrees.

13. The step mask of claim 9 further comprising an etch loading balance frame.

14. The step mask of claim 9 further comprising at least two alignment marks.

15. The step mask of claim 9 further comprising at least one opaque layer thickness monitor.

16. The step mask of claim 9 wherein said substrate is quartz.

* * * * *